United States Patent
Hoshika

(10) Patent No.: US 7,586,581 B2
(45) Date of Patent: Sep. 8, 2009

(54) DEVELOPING METHOD OF PHOTORESIST AND DEVELOPING DEVICE

(75) Inventor: Masato Hoshika, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 322 days.

(21) Appl. No.: 11/173,400

(22) Filed: Jul. 1, 2005

(65) Prior Publication Data

US 2006/0003270 A1  Jan. 5, 2006

(30) Foreign Application Priority Data

Jul. 2, 2004  (JP) .............................. 2004-196920

(51) Int. Cl.
*G03B 27/32* (2006.01)

(52) U.S. Cl. ....................................... 355/27

(58) Field of Classification Search ............. 355/27–29; 396/611

See application file for complete search history.

(56) References Cited

U.S. PATENT DOCUMENTS

| | | | |
|---|---|---|---|
| 4,564,280 A * | 1/1986 | Fukuda | 396/611 |
| 5,740,488 A | 4/1998 | Fujimoto | |
| 5,821,035 A | 10/1998 | Hirano et al. | |
| 6,207,358 B1 | 3/2001 | Jeon et al. | |
| 6,893,172 B2 * | 5/2005 | Nakamura et al. | 396/611 |
| 2003/0108823 A1 | 6/2003 | Muraoka et al. | |

FOREIGN PATENT DOCUMENTS

| | | |
|---|---|---|
| CN | 1392972 A | 1/2003 |
| EP | 0 110 558 A2 | 6/1984 |
| EP | 0 769 725 A2 | 4/1997 |
| EP | 0 982 630 A2 | 3/2000 |
| JP | 55-064234 | 5/1980 |
| JP | 59-063726 A | 4/1984 |
| JP | 03-020017 | 1/1991 |
| JP | 05-090550 | 4/1993 |
| JP | 07-326555 | 12/1995 |
| JP | 09-139345 | 5/1997 |
| JP | 10-146560 | 6/1998 |
| JP | 11-076918 | 3/1999 |
| JP | 2000-232058 | 8/2000 |
| JP | 2001-257334 | 9/2001 |
| JP | 2002-299230 | 10/2002 |
| JP | 2004-296453 | 10/2004 |
| KR | 1998-003089 | 9/1998 |
| KR | 1999-0041353 | 6/1999 |
| KR | 2001-0086993 | 9/2001 |
| TW | 584893 | 4/2004 |

* cited by examiner

*Primary Examiner*—D. Rutledge
(74) *Attorney, Agent, or Firm*—Edwards Angell Palmer & Dodge LLP; David G. Conlin; David A. Tucker

(57) ABSTRACT

A developing device according to the present invention comprises a turntable, a motor for rotating the turntable and a spraying nozzle for spraying mixture of developer and nitrogen gas onto the turntable in mist form. The turntable is rotated at a rotational speed of 200 rpm by driving the motor, the developer for developing the photoresist that has been formed on the upper surface of a semiconductor wafer fixed to the turntable is mixed with nitrogen gas, and the developer in mist form is sprayed from the spraying nozzle toward the turntable. The photoresist is surely removed due to the chemical reaction with the developer and the pressure of the spray of the developer.

4 Claims, 6 Drawing Sheets

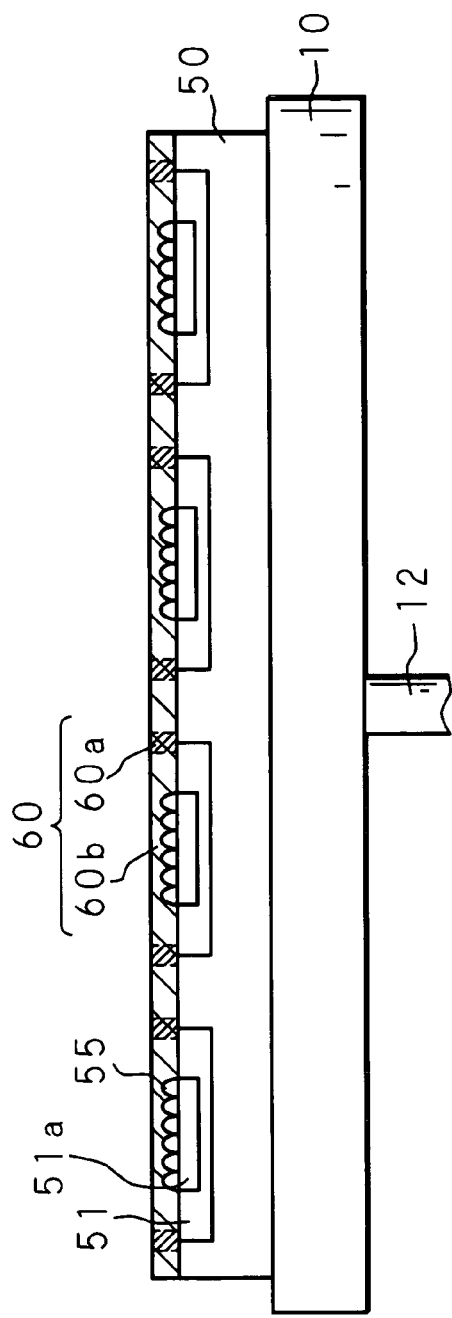
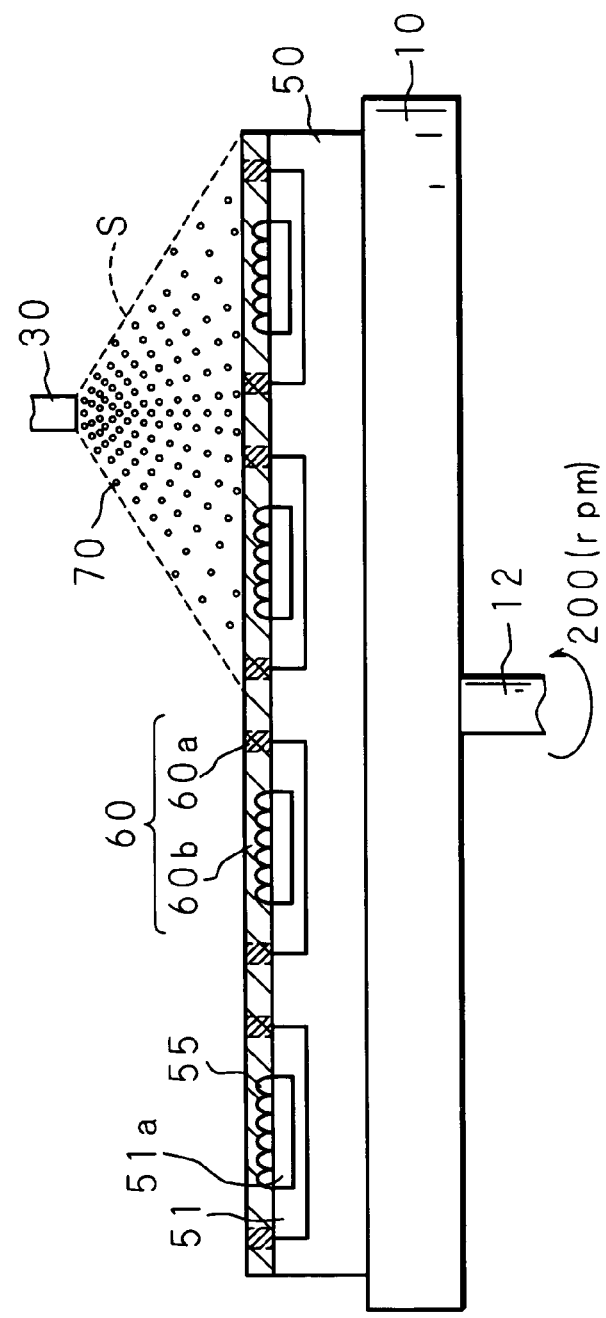

DEVELOPING METHOD OF PHOTORESIST AND DEVELOPING DEVICE

CROSS-REFERENCE TO RELATED APPLICATIONS

This Nonprovisional application claims priority under 35 U.S.C. §119(a) on patent application Ser. No. 2004-196920 filed in Japan on Jul. 2, 2004, the entire contents of which are hereby incorporated by reference.

BACKGROUND OF THE INVENTION

1. Field of the Invention

The present invention relates to a developing method of a photoresist which is part of a photolithographic technology utilized for the manufacture of semiconductors and a developing device, and in particular, to a developing method of a photoresist in which a photoresist having adhesion can be surely removed even in the case where the photoresist is formed on a substrate having a pattern including concavities and convexities, and a developing device for implementing the developing method.

2. Description of Related Art

A solid-state image pickup device, such as a CCD and a CMOS imager, which is a type of semiconductor devices, is utilized in a variety of fields. The solid-state image pickup device comprises circuits such as a light receiving part made of a photodiode, a read-out part for reading out electrical signals on the basis of the output of the light receiving part, or the like. The solid-state image pickup device is manufactured by layering a plurality of layers on a semiconductor wafer, using a photolithographic technology which, itself, is well known.

In recent years, an increase in the density, an increase in the resolution and miniaturization of the solid-state image pickup device have been in demand, and the size of the pitch per pixel has tended to be smaller. In order to satisfy this demand, the area of the light receiving part (hereinafter referred to as a light receiving region) must be reduced. In the case where a light receiving region is reduced, the amount of received light is reduced, and the dynamic range is reduced, and therefore, it is necessary to compensate for the reduction in the amount of received light by arranging micro-lenses on the light receiving part.

Generally, micro-lenses are formed by processing a transparent resin into lens form, on the surface of a semiconductor chip where a functional element for a solid-state image pickup device has been formed. Accordingly, the surface of the solid-state image pickup device is in a pattern including concavities and convexities, due to micro-lenses. The light receiving surface of the solid-state image pickup device is extremely important for a sensor, and in the case where a foreign substance adheres to the light receiving surface, the level of reproduction of the picked up image is lowered, due to a change in the brightness and color tone caused by the foreign substance, and there is a risk that the light receiving surface may be scratched. Thus, the quality and reliability of the solid-state image pickup device are damaged by adherent foreign substances, and therefore, the light receiving surface of the solid-state image pickup device is protected with a transparent lid, such glass etc., so that no foreign substance adheres to the light receiving surface.

As described above, a solid-state image pickup device has a structure where the light receiving surface is protected by a lid, and in particularly, the surface of the solid-state image pickup device where micro-lenses are formed on the chip is in extremely complicated form including concavities and convexities. Therefore, the light receiving surface is covered with the lid after mounting the semiconductor chip in a package case, such as ceramics, plastic etc., and the solid-state image pickup device has a structure where no foreign substance can enter from the outside, in the state where the solid-state image pickup element is protected within the package case. However, miniaturization of the structure of the solid-state image pickup device mounted in a package is limited, and therefore, as shown in FIG. 1, a structure has been proposed, where glass 106 adheres with an adhesive 105 by the use of an epoxy resin sheet 104 having a hollow portion 103 only above a light receiving part 102 to the surface of a semiconductor chip 101 where a solid-state image pickup element has been formed (see, for example, Japanese Patent Application Laid-Open No. 2001-257334). Thus, the glass 106 (lid) directly adheres to the semiconductor chip 101, thereby miniaturizing the solid-state image pickup device, as compared to the solid-state image pickup device mounted in a package.

In order to manufacture a solid-state image pickup device as described above, however, the epoxy resin sheet 104 is used in order to secure a space between the glass plate 106 and the semiconductor chip 101, and the glass plate 106 adheres to the semiconductor chip 101 by applying the adhesive 105 on the both surfaces of the epoxy resin sheet 104. A hole is formed in the epoxy resin sheet 104 so that the sheet is not placed on the light receiving part 102. Therefore, tension applied to the sheet becomes uneven, due to the effect of the hole, and there is a problem that an adhering process is highly difficult by the extremely unstable form of the epoxy resin sheet 104 when the epoxy resin sheet 104 adheres. In addition, in the case where the epoxy resin sheet 104 adheres to the surface of the semiconductor chip 101, time and effort are needed to position the epoxy resin sheet 104 relative to the semiconductor chip 101, and the measure for preventing pollution on the light receiving surface on which micro-lenses are placed is insufficient, and therefore, a problem arises where management of the manufacturing process is complicated.

In addition, the hollow portion 103 is formed in the epoxy resin sheet 104 through a process for forming a hole, and therefore, there is a limit to the miniaturization of the hollow portion 103. The size of the sealed space of the solid-state image pickup device is determined by the hollow portion 103, and therefore, there is a limit to the miniaturization of the structure of a solid-state image pickup device, even in the case where the method disclosed in Japanese Patent Application Laid-Open No. 2001-257334 is used.

In addition, in development of a photoresist used in a semiconductor process or the like, in the case where the surface of a substrate on which the photoresist is formed has concavities and convexities, it is easy for the photoresist to remain as residue in portions from which the photoresist must be removed. Though the surface of a semiconductor wafer formed a semiconductor element usually has a structure including concavities and convexities, particularly in the case of a semiconductor wafer formed a solid-state image pickup element, residue of the photoresist on top of the light receiving part sometimes causes defects.

BRIEF SUMMARY OF THE INVENTION

The present invention has been made with the aim of solving the above problem, and it is an object of the present invention to provide a developing method of a photoresist and a developing device in which a photoresist which has been formed on the surface of a substrate and exposed to light can be selectively removed by spraying developer for developing the photoresist in mist form.

Another object of the present invention is to provide a developing method of a photoresist and a developing device in which a photoresist can be removed using the chemical reaction between developer and the photoresist by adjusting the pressure of the developer and gas so as to spray the mixture of the developer and the gas in mist form, and the photoresist can be removed using the physical effect of the pressure of the developer that has been sprayed in mist form.

Still another object of the present invention is to provide a developing method of a photoresist and a developing device in which a photoresist can be efficiently removed by spraying developer from above a point which is approximately one half of the distance between the rotational center of a substrate and the edge portion of the region of the substrate to be exposed to the developer during rotating the substrate.

The present inventor has diligently conducted research a manufacturing method where an adhesive layer to be a frame is formed on a semiconductor wafer before being separated into semiconductor chips by means of a photolithographic technology, thereby achieving an increase in the precision of positioning of the frame and an increase in the efficiency of the manufacture, as compared to the prior art described in the above Japanese Patent Application Laid-Open No. 2001-257334. Appropriate amounts of a photo curing adhesive and a thermosetting adhesive are mixed so as to be used as the adhesive layer. By means of the property of the photo curing adhesive included in the adhesive layer, the adhesive layer is patterned into a desired form, and the patterned adhesive layer is heated after a transparent lid such as glass etc., has been placed thereon, and thus, the semiconductor layer and the lid can adhere to each other via the adhesive layer by using the property of the thermosetting adhesive included in the adhesive layer. Namely, the photo curing adhesive works as a so-called photoresist and after the photoresist has been exposed to UV light or the like, the portion of the photoresist that has not been exposed to light is removed by developing the photoresist using predetermined developer. In this manner, the semiconductor wafer and the lid adhere to each other via the adhesive layer, and thereby, a space is formed, and effects (moisture, dust and the like) from the outside can be prevented. Furthermore, since a photolithographic technology is utilized, it is extremely easy to process the width of the adhesive layer to 100 µm to 200 µm and the thickness (height) to 50 µm to 60 µm, and therefore, miniaturization of the semiconductor device can be achieved, and a high quality and reliable semiconductor device in chip size can be implemented.

Here, the developing used in the photolithographic technology is described in reference to FIGS. 2A and 2B. In the case where a photoresist is exposed to light via a photo mask and developed using predetermined developer after the photoresist has been formed on one side (one plane or one surface) of a semiconductor wafer, as shown in FIGS. 2A and 2B, developer 112 is dropped on the surface of photoresist 111 and spread over the entirety of the surface. The state where the photoresist 111 is coated with the developer 112 is maintained for a predetermined period of time for development (etching time) (FIG. 2A) and photoresist 111b is removed using the chemical reaction between the portion of the photoresist 111b that has not been exposed to light and the developer 112, while the portion of photoresist 111a that has been exposed to light remains (FIG. 2B).

As shown in FIG. 3, however, in the case where the surface of semiconductor wafer 110 has a pattern 120 of a sharp trench form including concavities and convexities like solid-state image pickup devices having micro-lenses on the surface thereof, there is a risk that residue 121 of the photoresist may remain in recesses 120a. In particular, in the case where the photoresist is adhesive, the photoresist adheres to the recesses 120a, and therefore, it is extremely difficult to completely remove the photoresist from the recesses 120a using the chemical reaction between the photoresist and the developer. It may, of course, be considered possible to eliminate the residue 121 of the photoresist by making the developing time longer. In the case where the developing time is made to be long, however, the efficiency in the manufacture is, of course, lowered, and therefore, implementation of a technology for effectively removing a photoresist has been in demand.

In response to this demand, according to the present invention, a technology for efficiently removing a photoresist can be implemented.

A developing method of a photoresist according to the present invention is a developing method of a photoresist which has been formed on the surface of a substrate and exposed to light is developed, characterized in that developer for developing the photoresist is sprayed in mist form onto the surface of the substrate, and the photoresist is selectively removed.

According to the present invention, developer for developing the photoresist which has been formed on the surface of a substrate and exposed to light is sprayed in mist form onto the surface of the substrate, and thereby, the photoresist can be selectively removed using the chemical reaction between the developer and the photoresist, and the photoresist can be selectively removed using the physical effect of the pressure of the developer sprayed in mist form. In particular, though the photoresist that has been exposed to light is not dissolved in predetermined developer due to the occurrence of a photo polymerization reaction caused by exposure to light, the property of the photoresist that has not been exposed to light does not change, and is dissolved in the developer, and therefore, the photoresist that has not been exposed to light can be selectively removed.

The developing method of a photoresist according to the present invention is characterized in that the pressure of the developer and gas is adjusted so as to mix the developer with the gas and spray in mist form.

According to the present invention, the developer is mixed with gas, such as nitrogen gas, and sprayed in mist form onto the surface of a substrate. The pressure of the developer and the gas is adjusted in accordance with the form of the surface, and thereby, the pressure applied to the photoresist, that is to say, the physical effect can be appropriately adjusted, and thereby, the photoresist can be surely removed, whatever the surface form.

The developing method of a photoresist according to the present invention is characterized in that the photoresist is adhesive.

According to the present invention, even in the case where the photoresist is adhesive and adheres to the surface of the substrate, the photoresist can be removed using the physical effect of the pressure of the developer sprayed in mist form. The pressure of the developer and the gas is adjusted in accordance with the adhesion force between the photoresist and the surface of the substrate, so that pressure that is higher than the adhesion force between the photoresist and the surface of the substrate can be applied to the photoresist.

The developing method of a photoresist according to the present invention is characterized in that the region of the substrate exposed to the developer is in approximately circular form, and the developer is sprayed from above a point at approximately one half of the distance between the rotational center of the substrate and the edge portion of the region of the substrate to be exposed to the developer during rotating the substrate.

According to the present invention, the region of the substrate exposed to the developer is in approximately circular form, and the developer is sprayed in mist form from above a point at approximately one half of the distance between the rotational center of the substrate and the edge portion of the region of the substrate to be exposed to the developer during rotating the substrate, and thereby, the developer is uniformly sprayed onto the photoresist, and thus, the photoresist can be efficiently removed.

The developing method of a photoresist according to the present invention is characterized in that a pattern including concavities and convexities is formed on the substrate.

According to the present invention, even in the case where a pattern including concavities and convexities is formed on the substrate, the photoresist that has been formed in recesses can be surely removed using the chemical reaction between the developer and the photoresist, and the physical effect of the pressure of the developer.

The developing method of a photoresist according to the present invention is characterized in that a solid-state image pickup element having (a) micro-lens(es) is formed on the substrate.

According to the present invention, even in the case where a solid-state image pickup element having micro-lenses is formed on a substrate, the photoresist that has been formed in gaps between adjacent micro-lenses can be surely removed using the chemical reaction between the developer and the photoresist, and the physical effect of the pressure of the developer. Accordingly, there is a risk that photoresist may remain on micro-lenses of a solid-state image pickup element, thereby reducing the amount of received light, and lowering the performance of the solid-state image pickup element, for example, in the conventional method, however, in accordance with the present invention, since photoresist does not remain on micro-lenses, there is no risk of the performance being lowered, and it is possible to manufacture a high quality and reliable solid-state image pickup element.

A developing device according to the present invention is a developing device for developing a photoresist which has been formed on the surface of a substrate and exposed to light, characterized by comprising a table having a rotational axis, on which the substrate is placed, a rotational means for rotating the rotational axis, and a nozzle for spraying developer for developing the photoresist in mist form.

According to the present invention, a substrate is placed on a table and the rotational axis of the table is rotated by means of a rotational means, such as a motor. Then, developer for developing the photoresist which has been formed on the surface of the substrate and exposed to light is sprayed in mist form onto the surface of the substrate from the nozzle, and thereby, the photoresist can be selectively removed using the chemical reaction between the developer and the photoresist, and the photoresist can be selectively removed using the physical effect of the pressure of the developer sprayed in mist form.

The developing device according to the present invention is characterized by further comprising an adjusting means for adjusting the position of the nozzle relative to the table.

According to the present invention, the position of the spraying nozzle relative to table is adjusted by means of the adjusting means, and thereby, the relative position between the nozzle and the table is adjusted in accordance with two dimensions of the substrate. As a result, the nozzle can be arranged above a point at approximately one half of the distance between the center (rotational center) of the table (that is to say, the substrate) and the edge portion of the region of the substrate to be exposed to the developer. Accordingly, the developer sprayed from the nozzle is sprayed uniformly in mist form onto the photoresist, and thereby, the photoresist can be efficiently removed.

According to the present invention, the developer for developing the photoresist is sprayed in mist form, and thereby, the photoresist can be selectively removed using the chemical reaction between the developer and the photoresist, and the photoresist can be selectively removed using the physical effect of the pressure of the developer sprayed in mist form. Even in the case where the photoresist is adhesive, the pressure of the spray of the developer is adjusted in accordance with the adhesion force between the photoresist and the surface of the substrate, and pressure that is higher than the adhesion force between the photoresist and the surface of the substrate is applied to the photoresist, thereby the photoresist can be surely removed.

According to the present invention, the pressure of the developer and the gas is adjusted in accordance with the surface form, and thereby, pressure applied to the photoresist, that is to say, the physical effect can be appropriately adjusted so that the photoresist can be surely removed, whatever the surface form. Residue of photoresist in recesses which is not removed in the conventional developing method, for example, in the case where a pattern including concavities and convexities is formed on the substrate or in the case where a solid-state image pickup element having micro-lenses is formed on the substrate, can be eliminated by adjusting the pressure.

According to the present invention, excellent effects can be gained, such that the developer is sprayed from above a point at approximately one half of the distance between the rotational center of the substrate and the edge portion of the region of the substrate to be exposed to the developer during rotating the substrate, and thereby, the developer is uniformly sprayed onto the photoresist, and thus, the photoresist can be efficiently removed.

The above and further objects and features of the invention will more fully be apparent from the following detailed description with accompanying drawings.

BRIEF DESCRIPTION OF THE SEVERAL VIEWS OF THE DRAWINGS

FIGS. 5A and 5B are diagrams for illustrating a developing method of a photoresist according to the present invention.

DETAILED DESCRIPTION OF THE INVENTION

The following description will explain the present invention in the concrete with reference to the drawings illustrating an embodiment thereof. A developing method of a photoresist and a developing device according to the present invention are suitable in the case where a photoresist that has been formed on a substrate of which the surface has a pattern including concavities and convexities is developed, and therefore, a case is described where a photoresist is formed on a semiconductor wafer where a solid-state image pickup element having micro-lenses has been formed.

Figure 4:
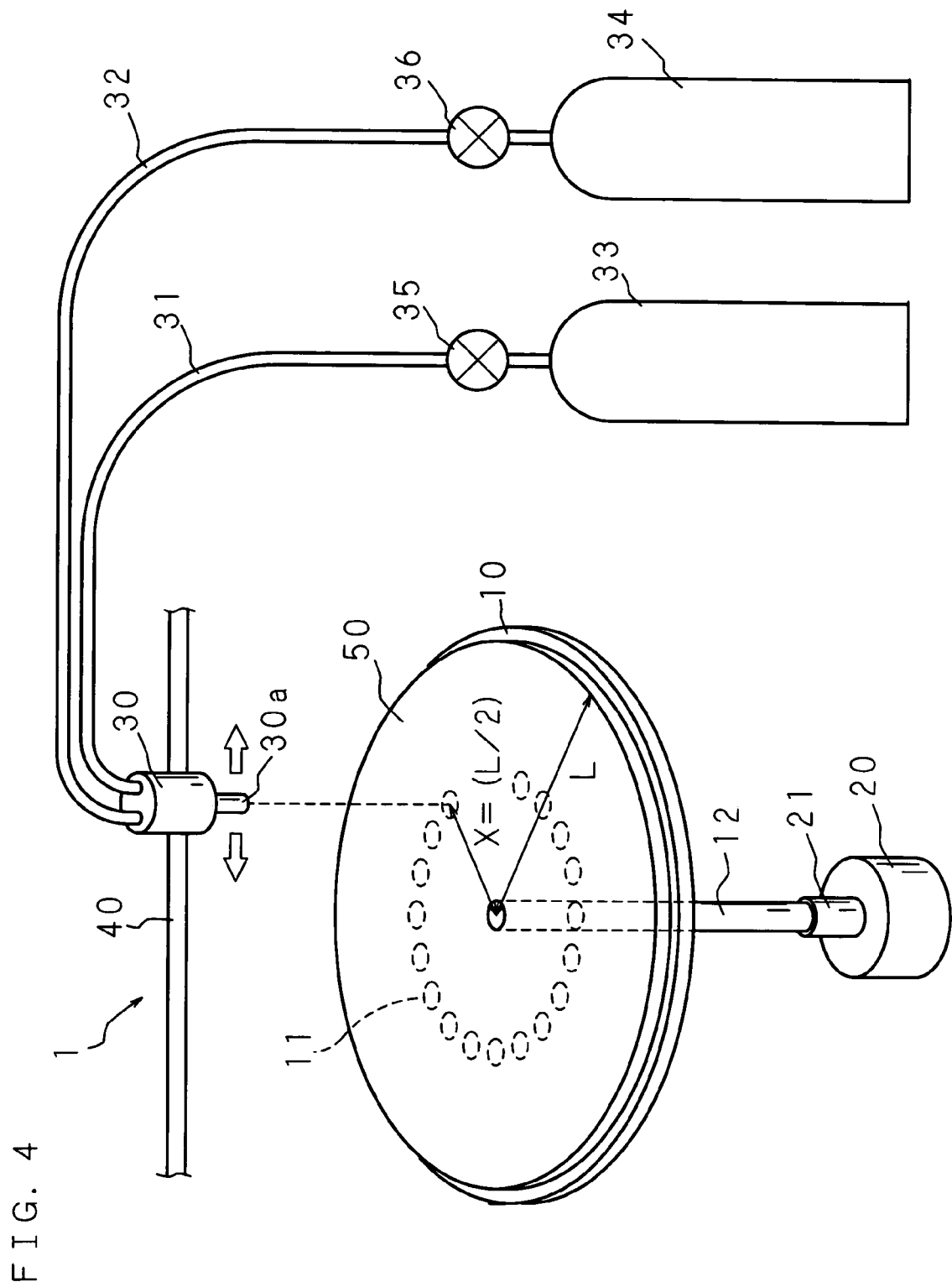
FIG. 4 is a perspective diagram showing the configuration of a developing device according to the present invention.

FIG. 4 is a perspective diagram showing the configuration of a developing device according to the present invention.

A developing device 1 according to the present invention comprises a turntable 10, a motor 20 for rotating the turntable 10, and a spraying nozzle 30 for spraying mixture of developer and nitrogen gas in mist form onto the turntable 10.

The turntable 10 is approximately in circular form in the plan view, and is provided with suction portions 11 for sucking a semiconductor wafer 50, which is a substrate, on a table surface (top surface). By sucking air through the suction portions 11, the semiconductor wafer 50 is fixed to the turntable 10 due to the vacuum. In addition, a shaft 12 is attached to the center of the lower surface of the turntable 10. The shaft 12 is linked to a rotational axis 21 of the motor 20. Power supply to the motor 20 is controlled by a control unit, not shown, and the direction and speed of rotation thereof are controlled.

A developer tank 33 filled with developer and a nitrogen gas tank 34 filled with nitrogen gas are connected to the spraying nozzle 30 via a developer supplying pipe 31 and a nitrogen gas supplying pipe 32, respectively. An adjustment valve 35 for adjusting the pressure for supplying the developer and the amount of developer is attached to a portion where the developer supplying pipe 31 and the developer tank 33 are connected to each other. An adjustment valve 36 for adjusting the pressure for supplying the nitrogen gas and the amount of gas is attached to a portion where the nitrogen gas supplying pipe 32 and the nitrogen gas tank 34 are connected to each other.

The ratio of the mixture of developer and nitrogen gas and the supplied amount are appropriately adjusted by the adjustment valves 35 and 36, and the developer is sprayed from the spraying nozzle 30 in mist form. The adjustment valves 35 and 36 are, of course, appropriately adjusted on the basis of the form of the end of the spraying nozzle 30, the type of developer, the type of gas, the separation of the spraying nozzle 30 and the semiconductor wafer 50 placed on the turntable 10, so that the developer can be sprayed from the spraying nozzle 30 in mist form.

The spraying nozzle 30 is installed above the table surface of the turntable 10, and end 30a of the spraying nozzle 30 is placed above a point which is approximately one half along the radius L from the center (X=L/2) of the semiconductor wafer 50 placed on the turntable 10. Here, the spraying nozzle 30 is attached to an adjustment device (not shown) for adjusting the position of the spraying nozzle 30 relative to the turntable 10, and the position of the spraying nozzle 30 relative to the turntable 10 is adjusted in accordance with two dimensions of the semiconductor wafer 50, thereby changing appropriately the position of the spraying nozzle 30. According to the present embodiment, an example is shown where the spraying nozzle 30 can be moved to the right and to the left along a shaft 40.

In the case where the size of the semiconductor wafer 50 is 8 inches (diameter), for example, the spraying nozzle 30 is arranged at a point two inches from the center of the turntable 10. Thus, the developer is uniformly sprayed onto a photoresist from the spraying nozzle 30, even in the case where the photoresist is formed on the entire surface of the semiconductor wafer 50.

Here, the spraying nozzle 30 may be moveable between the center and the periphery of the turntable 10 in the developing device, or the developing device may be provided with a plurality of spraying nozzles, as long as the developer is sprayed from the spraying nozzle onto the entire surface of the photoresist that has been formed on the semiconductor wafer 50 in mist form.

FIGS. 5A, 5B, 6A and 6B are diagrams for illustrating a developing method of a photoresist according to the present invention. Here, FIGS. 5A and 5B show an example where four semiconductor elements 51 are provided, in order to facilitate understanding.

First, the semiconductor wafer 50 where a photoresist 60 has been formed on the surface thereof is placed on the turntable 10 (FIG. 5A). A plurality of solid-state image pickup elements 51, 51 . . . , such as a CCD and a CMOS imager, are formed on the semiconductor wafer 50. A light receiving part 51a, such as a photodiode, is formed in approximately the center region of the solid-state image pickup element 51. Furthermore, in the solid-state image pickup element 51, a peripheral circuit, such as a readout part for reading out an electrical signal on the basis of the output of the light receiving part and, a processing circuit, such as an amplification circuit for amplifying the electrical signal that has been read out, are formed in addition to the light receiving part. These parts and circuits are manufactured using a technology that is, in itself, well known, through an impurity implantation and diffusion process, an oxidization and etching process, a layering process for layering a variety of layers and the like. Furthermore, micro-lenses 55 are formed on the upper surface of the light receiving part 51a so as to increase the ratio of light collection to the light receiving part 51a. The micro-lenses 55 are formed by processing a transparent resin on the surface of the semiconductor wafer 50 into lens form. Here, in order to increase the amount of light received by the light receiving part 51a, lenses may be formed in advance within layers, in addition to the micro-lenses 55 positioned in the uppermost layer of the semiconductor wafer 50. Consequently the optical system is formed of multiple layers, and thus, the light receiving ratio further be increased.

In addition, the photoresist 60 is exposed to light via a photo mask, and a photoresist 60a on a region that does not include the light receiving parts 51a is at least exposed to light, while a photoresist 60b on a region that includes the light receiving parts 51a is not at least exposed to light. In addition, the photoresist 60 is adhesive, and the photoresist 60a that has been exposed to light is cured, while the photoresist 60b that has not been exposed to light remains adhesive. The photoresist 60 is made of a material where an ultraviolet (UV) curing resin which is, for example, an acryl based resin, and a thermosetting resin, which is, for example, an epoxy based resin, are appropriately mixed (for example, with a mixture ratio of 1:1). This photoresist 60 functions as an adhesive, and the photo curing resin included in the photoresist 60 becomes adhesive due to exposure to light, and thus, the photoresist 60a that have been exposed to light adheres to the semiconductor wafer 50.

Next, by driving the motor 20, the turntable 10 is rotated at a rotational speed of 200 round per minute (rpm), the developer for developing the photoresist 60 is mixed with nitrogen gas, and developer 70 in mist form is sprayed from the spraying nozzle 30 toward the turntable 10 (FIG. 5B). The adjustment valves 35 and 36 are appropriately adjusted, and the developer under a pressure of 0.1 MPa and nitrogen gas under a pressure of 0.2 MPa, for example, are mixed, and thereby spraying the developer from the spraying nozzle 30 in mist form.

In addition, the form of the end of the spraying nozzle 30 is adjusted so as to spray the developer 70 from the spraying nozzle 30 in fan shape (symbol: S) as viewed from the side. Thus the developer 70 mixed with nitrogen gas can be sprayed over the entire surface of the semiconductor wafer 50 from one spraying nozzle 30, and therefore, the photoresist 60 can be efficiently removed, even in the case where the photoresist 60 has been formed on the entire surface of the semiconductor wafer 50.

Figure 6A:
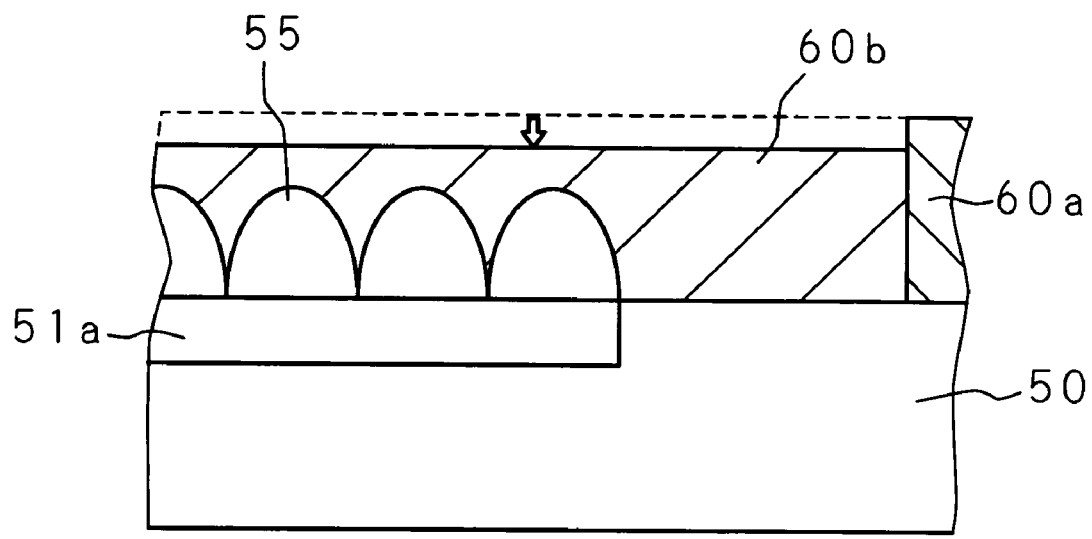
FIGS. 6A and 6B are diagrams for illustrating the developing method of a photoresist according to the present invention.

Thus, the photoresist 60b that has not been exposed to light from among the photoresist 60 over which the developer 70 is sprayed causes a chemical reaction with the developer 70 to start being removed from the semiconductor wafer 50 (FIG. 6A). Namely, a photo polymerization reaction starts by exposure to light in the photoresist 60a that has been exposed to light, which becomes insoluble in predetermined developer, while the property of the photoresist 60b that has not been exposed to light does not change and dissolves in the developer, and therefore, the photoresist 60b that has not been exposed to light from among the photoresist 60 can be selectively removed.

Figure 1:
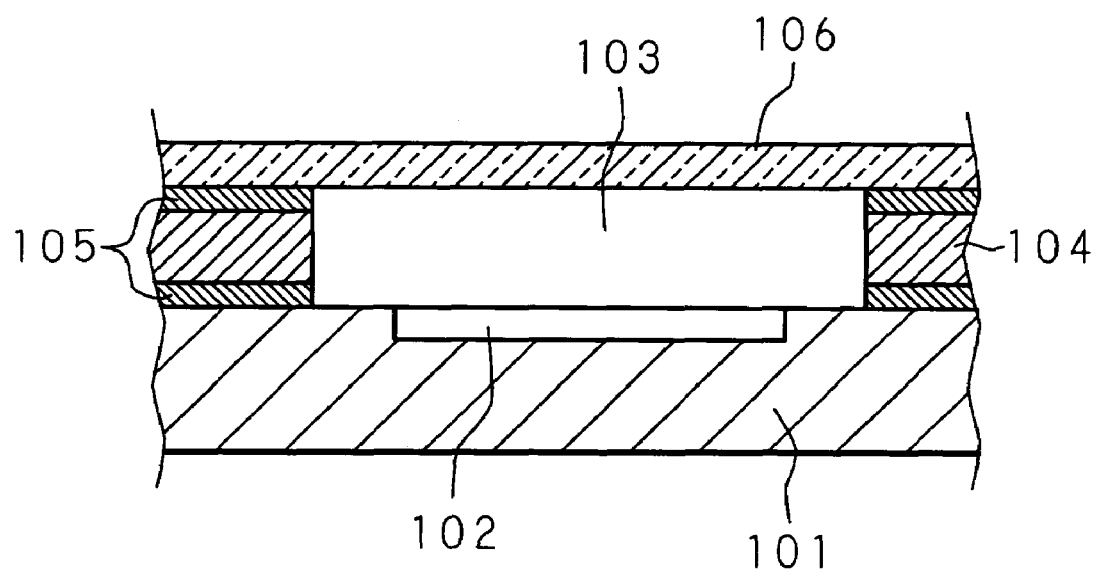
FIG. 1 is a structural cross sectional diagram showing the configuration of a solid-state image pickup device.
Figure 2A:
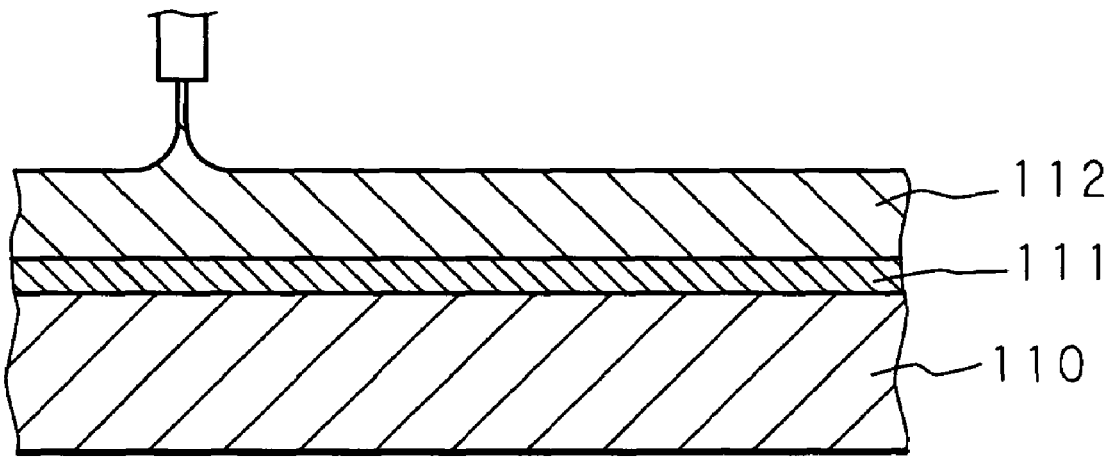
FIGS. 2A and 2B are diagrams for illustrating a conventional developing method of a photoresist.
Figure 2B:
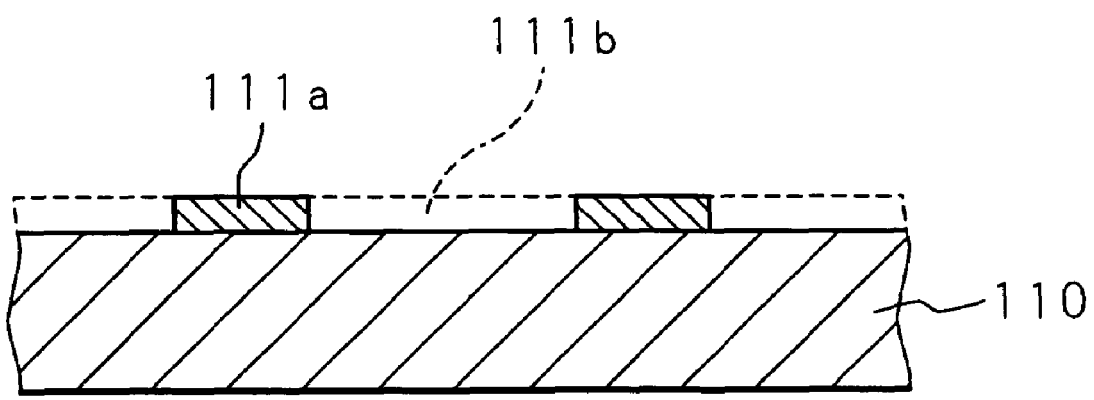
Figure 3:
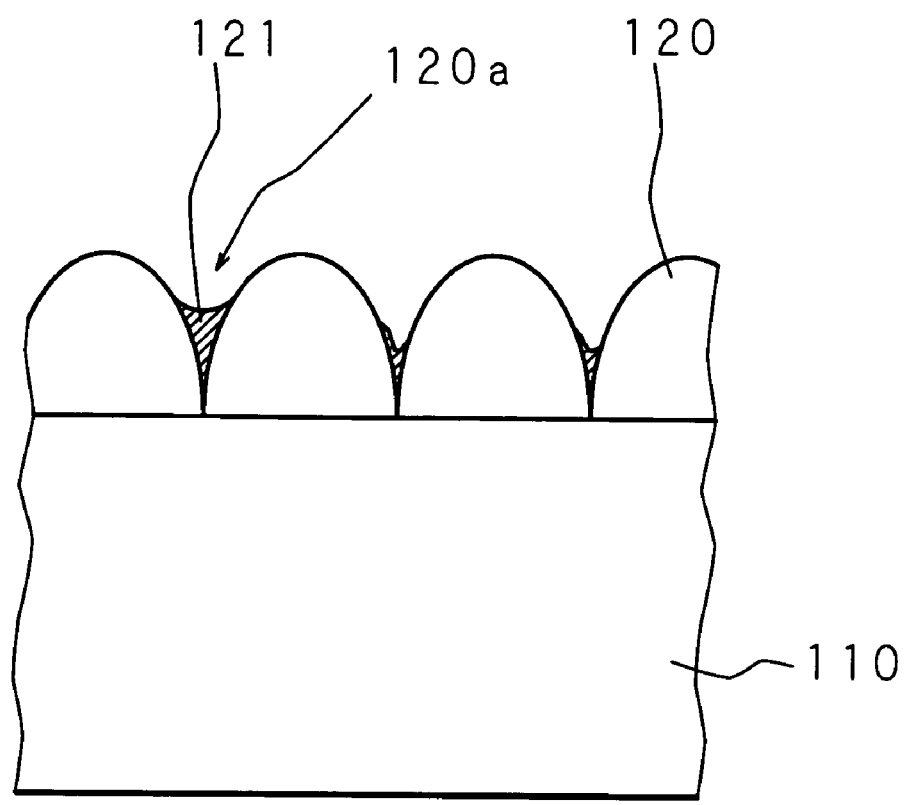
FIG. 3 is a diagram showing an example of the state of residue of a photoresist.
Figure 6B:
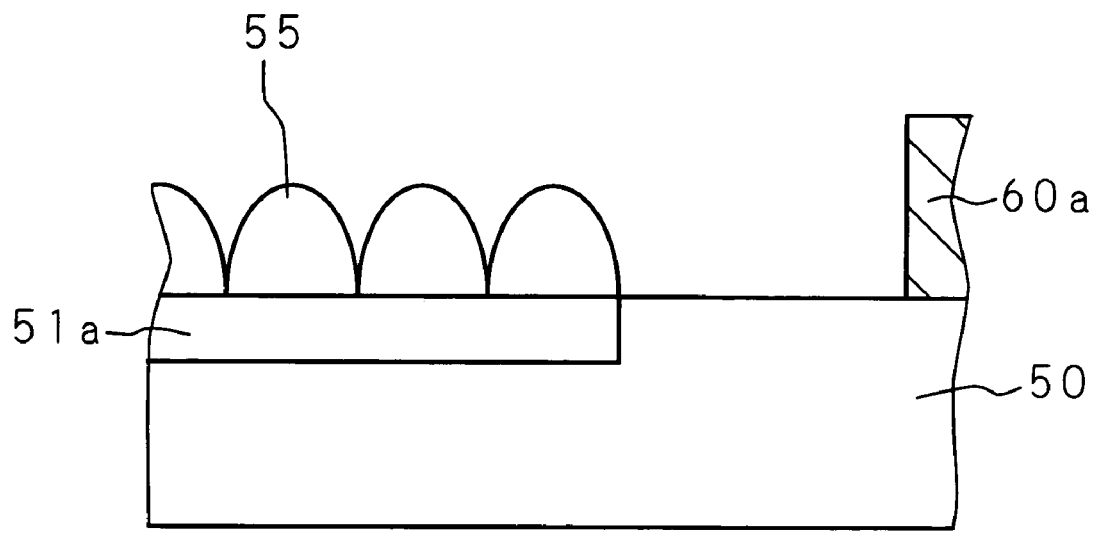

Thus, in the state where most of the photoresist 60b that has not been exposed to light is removed, the photoresist 60b that has been formed in gaps between the adjacent micro-lenses 55 remains as residue, due to its adhesiveness, according to the prior art (see FIG. 3). According to the present invention, however, the developer 70 is sprayed onto the photoresist 60, and therefore, the residue is surely removed due to the physical effect of the pressure of the spray (FIG. 6B). Even in the case where the photoresist 60 is adhesive, the pressure of the spray of developer is adjusted in accordance with the adhesion force between the photoresist 60 and the semiconductor wafer 50, and a pressure higher than the adhesion force is applied to the photoresist 60, thereby the photoresist 60 can be surely removed.

Here, though not shown, after these processes, by placing glass on top of the photoresist 60a that has been patterned as described above as a lid and then applying heat, the thermosetting resin included in the photoresist 60a becomes adhesive, and the photoresist 60a adheres to the semiconductor wafer and the lid (glass). By cutting into individual solid-state image pickup devices, a structure is provided where the semiconductor wafer and the lid (glass) adhere to each other via an adhesive layer, and where a space is formed, thereby preventing effects (moisture, dust and the like) from the outside.

As described in detail above, the photoresist 60b that has not been exposed to light is removed using the chemical reaction between the developer 70 and the photoresist 60, and photoresist 60b is removed using the physical effect of the pressure of the developer 70 sprayed from the spraying nozzle 30 in mist form. Accordingly, no resist remains on the surface of the micro-lenses 55, and therefore, the amount of light that enters into the solid-state image pickup element 51 is not lowered due to residue of the resist.

Here, though a case is described where the micro-lenses 55 are formed on the semiconductor wafer 50 side in the embodiment, the invention can be similarly applied to a case where the micro-lenses are formed on a glass plate that is a lid for coating the light receiving surface of a solid-state image pickup element, and a patterned adhesive layer is formed on the glass plate side. In this case, a two-dimensional glass plate that can cover at least the element formation region of the semiconductor wafer is used, and after the glass plate adheres to the semiconductor wafer, the glass plate can be divided together with the semiconductor wafer into individual solid-state image pickup devices.

As described above, though concrete embodiments of a developing method of a photoresist and a developing device according to the present invention are illustrated, the present invention is not limited to these embodiments. It is possible for those skilled in the art to modify or change the configuration and the functions of the above described embodiments according to the invention in a variety of manners within a scope that does not deviate from the gist of the present invention.

As described above, according to the present invention, even in the case where a photoresist that has been formed on a substrate having a pattern including concavities and convexities with deep trenches is developed, the photoresist can be developed, and unnecessary photoresist can be surely removed, and therefore, the invention is useful for application to the manufacture of a semiconductor device. Particularly, in a solid-state image pickup device having micro-lenses, there is a risk that the amount of received light might be lowered and the performance of the solid-state image pickup device might be lowered by remaining photoresist on micro-lenses, according to a conventional method. However, by means of the present invention, no photoresist remains on a micro-lens, and therefore, there is no risk of the performance being lowered, and it becomes possible to manufacture a high quality and highly reliable solid-state image pickup device.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A developing device for developing a photoresist which has been formed on a surface of a substrate and exposed to light, comprising:
   a table having a rotational axis, on which the substrate is placed;
   a rotating unit for rotating the rotational axis;
   adjustment valves for adjusting according to the surface of the substrate an amount and a pressure of a developer for developing the photoresist and of a gas, and
   a nozzle for spraying the developer for developing the photoresist in mist form.

2. The developing device according to claim 1, further comprising an
   adjustment unit for adjusting the position of the nozzle relative to the table.

3. A developing device for developing a photoresist which has been formed on a surface of a substrate and exposed to light, comprising:
   a table having a rotational axis, on which the substrate is placed;
   rotating means for rotating the rotational axis;
   adjustment valves for adjusting according to the surface of the substrate an amount and a pressure of a developer for developing the photoresist and of a gas, and
   a nozzle for spraying the developer for developing the photoresist in mist form.

4. The developing device according to claim 3, further comprising adjustment means for adjusting the position of the nozzle relative to the table.

* * * * *